United States Patent [19]

Okuzawa et al.

[11] Patent Number: 4,809,049
[45] Date of Patent: Feb. 28, 1989

[54] IMAGE RECORDING APPARATUS

[75] Inventors: Tugio Okuzawa; Ken Kawada, both of Kanagawa, Japan

[73] Assignee: Fuji Photo Film Co., Ltd., Kanagawa, Japan

[21] Appl. No.: 99,811

[22] Filed: Sep. 22, 1987

[30] Foreign Application Priority Data

Sep. 22, 1986 [JP] Japan ................................ 61-222210
Oct. 6, 1986 [JP] Japan ................................ 61-236181
Nov. 20, 1986 [JP] Japan ................................ 61-275389
Dec. 26, 1986 [JP] Japan ................................ 61-308766

[51] Int. Cl.$^4$ .......................................... G03B 29/00
[52] U.S. Cl. .................................................... 355/28
[58] Field of Search ......................... 355/27, 28, 107; 430/148, 149, 154, 157, 162, 171, 183, 331; 354/300

[56] References Cited

U.S. PATENT DOCUMENTS

4,624,560 11/1986 Beery ...................................... 355/27

Primary Examiner—Richard A. Wintercorn
Attorney, Agent, or Firm—Sughrue, Mion, Zinn, Macpeak and Seas

[57] ABSTRACT

An image recording apparatus in which an image is initially recorded on a flexible photosensitive material and is then pressure transferred to an image-receiving material. The drives for the image recording and the pressure transferring are separated so as to reduce the mechanical effect on the imaging either by putting the imaging in a separate unit or by providing separate drives. The supply of photosensitive material from a roll is deflected to a discard bin when the cut length is less than a recording minimum but all action is stopped if the cut length is less than a conveyable minimum. The photosensitive material and the image-receiving material are separated by a pawl controllably swinging into the path of the two material after the pressure transferring operation.

12 Claims, 8 Drawing Sheets

IMAGE RECORDING APPARATUS

BACKGROUND OF THE INVENTION

1. Field of the Invention

This invention relates to an image recording apparatus which uses a photosensitive material formed by coating a support with a substance with which an image formed through optical exposure is fixed under pressure.

2. Background of the Invention

One example of an image recording material utilizing microcapsules containing photosensitive composites has been disclosed, for instance, by Japanese patent application (OPI) No. 179836/1982 (the term "OPI" as used herein means "an unexamined Japanese published application). The image recording material is made up of a layer of capsules having synthetic macromolecular resin walls and containing a vinyl compound, a photopolymerization initiator and a colorant precursor formed on a support. In a image recording method using the image recording material, the image recording material is optically exposed so that the microcapsules are selectively hardened according to an image to be formed. The microcapsules which have not been hardened are broken by pressure so that the colorant cursor discharged therefrom forms a colored image. This method is advantageous in that an image of high picture quality can be obtained by a simple dry treatment. However, the image recording material shows much lower photosensitivity than a material which utilizes silver halide.

A novel recording material which, eliminating the above-described difficulty, shows high photosensitivity and can provide an image high in picture quality has been disclosed by the specification of Japanese patent application (OPI) No. 275,742/1986, filed by the present applicant. The recording material is formed by coating at least photosensitive silver halide, reducing agent, polymerizing compound and color image forming material on a support. The polymerizing compound and the color image forming material form a photosensitive composite in one and the same microcapsule.

An image recording method of recording images with this photosensitive material has been disclosed by Japanese patent application (OPI) No. 278,849/1986 filed by the present applicant. In the method, the photosensitive material is subjected to optical exposure to form a latent image therein and is then heated for developing the latent image. As a result, the polymerizing compound in a part or parts of the photosensitive material where the latent image has been formed is polymerized to form a macromolecular compound to harden the microcapsules. Under this condition, the photosensitive material thus treated is stacked under pressure on an image-receiving material which has an image-receiving layer onto which the color image forming material can be transferred. As a result, at least some of the microcapsules at a part or parts of the photosensitive material where no latent image has been formed are broken so that the color image forming material is transferred onto the image-receiving material to obtain the image thereon.

An image recording apparatus for automatically practicing the above-described image recording method has been disclosed, for instance, by the specification of Japanese patent application No. 51,896/1986, filed by the present applicant.

Figure 1:
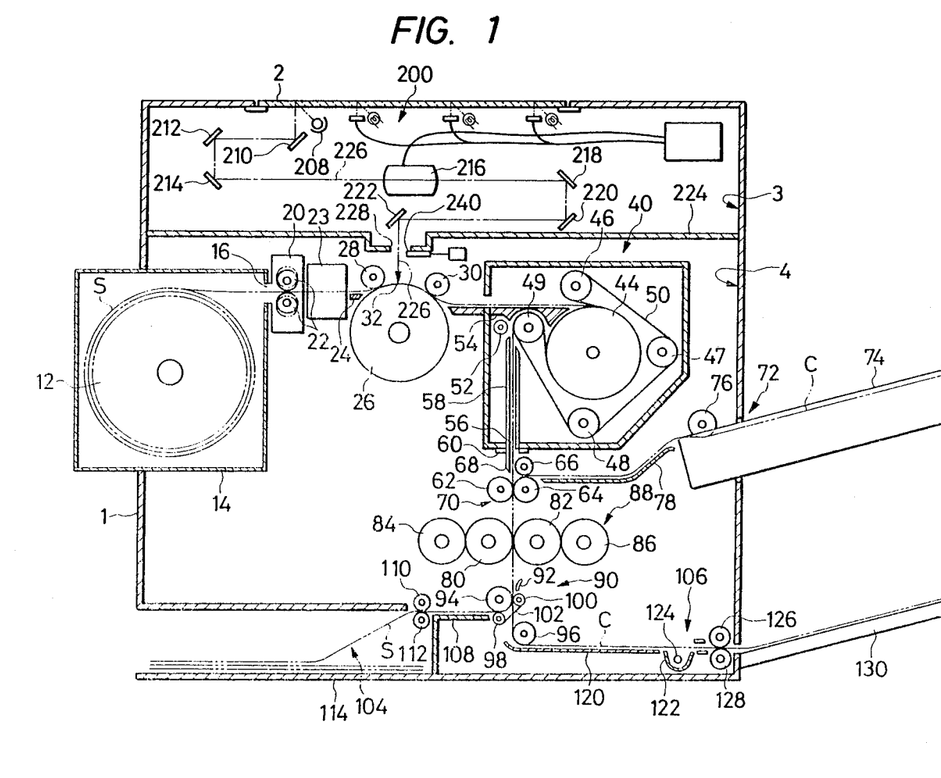
FIG. 1 is a sectional view showing the arrangement of an example of a conventional image recording apparatus.

FIG. 1 is a sectional view of image recording apparatus of this reference. The apparatus comprises an upper unit 3 and a lower unit 4. The upper unit 3 is an exposing device and accommodates an image-forming optical system 200. The lower unit 4 incorporates an exposed photosensitive material roll 26, a thermal developing device 40 and a transferring device 88. A photosensitive material S is processed while being conveyed in the lower unit 4.

However, the apparatus suffers from the following difficulty. Because of the synergistic effect of the installation accuracy of the image-forming optical system 200 in the upper unit 3, the installation accuracy of the exposed photosensitive material supporting roll 26 in the lower unit 4, and the assembly accuracy of the upper and lower units 3 and 4, the image-forming focusing position of the optical system sometimes greatly varies from the position of the photo-sensitive material S supported by the exposed photosensitive material supporting roll 26. Therefore, the image formed thereon through optical exposure is not distinct, being not accurately focused thereon, and the resultant record is low in picture quality.

Furthermore, in the conventional image recording apparatus of Japanese patent application No. 51896/1986, in order to prevent an increase of the size and to simplify the construction, the processing devices and the conveying means are driven by one and the same drive source, so that the variations of the loads of the processing devices and the conveying means are transmitted to one another through the drive system. This tendency is significant in the pressure transferring device. That is, in the pressure transferring device, the photosensitive material and the image-receiving sheet piled one on another are pressurized at 200 kg/cm$^2$ or higher by a pair of pressurizing rolls. Therefore, when the photosensitive material and the image receiving sheet go into and come out of the pressurizing rolls, a great impact is exerted on the transferring device so that the device is vibrated and the speed of rotation of the rolls is changed. The variation of the load of the pressurizing rolls is transmitted through the drive source to the exposing device. As a result, in the exposing device the original scanning speed and the photosensitive material conveying speed are changed thus adversely affecting the optical exposure.

In the conventional image recording apparatus of Japanese patent application No. 51896/1986, the photosensitive material and the image-receiving material which have been subjected to pressure transferring are separated from each other and conveyed. More specifically, the image-receiving material is conveyed to a fixing device when necessary, and the photosensitive materials is delivered to a discarding section.

In general, the photosensitive material is larger in area than the image-receiving material. Therefore, the photosensitive material and the image-receiving material piled one on an other are conveyed with the photosensitive material jutted out from an edge of the image-receiving material. Accordingly, in the separating device of the image recording apparatus, two side parts of the photosensitive material which extend beyond the image-receiving material across the material conveying path are held so that the photosensitive material is conveyed in a direction opposite to the direction of conveyance of the image-receiving material while the direction of the conveyance of the image-receiving material is controlled with a guide board. Thereby, the photosensitive material and the image-receiving material are separated from each other.

However, this method suffers from the following problem. Both side portions of the image-receiving material can be readily separated from the photosensitive material. However, it is rather difficult to separate the central portion (in the widthwise direction) of the image-receiving material from the photosensitive material. Therefore, the image-receiving material, following the photosensitive material, is not conveyed in the predetermined direction with the result that it is abutted against the guide board. That is, jamming of the image-receiving material occurs.

This problem is attributed to the fact that, in the image recording operation, the photosensitive material and the image-receiving material piled one on another are pressurized so that the photosensitive material and the image-receiving material adhere well to each another. This tendency is significant when the photosensitive material uses a macromolecular binder of gelatin or the like.

In the conventional image-recording apparatus of Japanese patent application No. 51896/1986, the photosensitive material and the image receiving material, after being subjected to pressure transferring, are separated from each other and delivered out. More specifically, the image-recording material is conveyed to a fixing device when necessary while the photosensitive material is conveyed to a discarding section.

In general, the photosensitive material is provided in the form of a roll. That is, it is supplied from the roll to the optical exposure section and cut to a predetermined length there. However, it should be noted that the last piece of photosensitive material remaining in the roll is not always long enough for optical exposure and image transfer. If the photosensitive material shorter than the predetermined length is subjected to optical exposure and image transfer, then only part of the image is transferred onto the image-receiving material. Furthermore, if the photosensitive material is shorter than a certain length which is required for positive conveyance of the photosensitive material in the image recording apparatus, then it may be jammed during conveyance.

SUMMARY OF THE INVENTION

Accordingly, a general object of this invention is to eliminate the above-described difficulties accompanying a conventional image recording apparatus.

A first specific object of this invention is to provide an image recording apparatus in which an image-forming optical system and an exposed photosensitive material supporting roll are positioned with high accuracy so that the focal point of the optical system is maintained on the photosensitive material at all times.

A second specific object of the invention is to provide an image recording apparatus in which the operation of the exposing device is free from the load variation caused in the pressure transferring device and in which the optical exposure is achieved accurately with the original scanning speed and the photosensitive material conveying speed maintained constant.

A third specific object of the invention is to provide an image recording apparatus in which, after the pressure transferring operation, the photosensitive material and the image-receiving material are positively separated from each other for prevention of jamming.

A fourth specific object of the invention is to provide a method of supplying a photosensitive material and an image-receiving material in which the difficulties that the image is not completely transferred and the last piece of photosensitive material shorter than a predetermined length is jammed in the image recording apparatus have been eliminated.

The foregoing objects of the invention have been achieved by the provision of an image recording apparatus in which an image is formed through optical exposure on a photosensitive material and in which the photosensitive material is formed by coating a support with a substance with which an image formed through optical exposure is fixed either thermally or under pressure.

According to the invention, in order to satisfy the first object, the image recording apparatus comprises an optical exposure device including at least an image-forming optical system and an exposed photosensitive material supporting roll incorporated in one unit. The exposed photosensitive material supporting roll is driven by a drive source, which is provided outside the unit for conveying the photosensitive material.

As the exposed photosensitive material supporting roll and the image-forming optical system are built in one and the same unit (as an optical exposure device), the accuracy in position of the optical system and the supporting roll is increased. Thus the image of an original can be formed distinctly on the photosensitive material.

As was described above, the exposed photosensitive material supporting roll is driven by the drive source which is provided outside the apparatus so as to convey the photosensitive material. Therefore, the photosensitive material is conveyed by the exposed photosensitive material supporting roll at the same speed as it is conveyed in the preceding or following processing steps.

In order to satisfy the second specific object, according to the invention, the image recording device comprises an optical exposing device having both original scanning means and a photosensitive material conveying means and a pressure transferring device having a pair of pressurizing rolls which are abutted against each other under pressure. The exposing device and the transferring device are driven by respective drive sources.

As was described above, the exposing device and the transferring device are driven by their own drive sources. Therefore, even if the load of the transferring device's drive source is varied by the impact which occurs in the transferring device, the exposing device's drive source can drive the exposing device without being affected by the load variation. The original scanning means and the photosensitive material conveying means are operated at a predetermined speed.

Thus, in the exposing device, the optical exposure is performed accurately without being adversely affected by the transferring device.

In order to satisfy the third specific object according to the invention, a separating means comprises conveying rolls, a photosensitive material detector disposed upstream of the conveying rolls, and a separating pawl arranged downstream of the conveying rolls. The separating pawl swings after the operation of the photosensitive material detector. The separating pawl is located downstream of a pressure transferring device which performs the pressure transferring operation.

In the image recording apparatus of the invention, a predetermined period of time after the photosensitive material detecting means detects the front edge of the photosensitive material piled on the image-receiving material, the separating pawl is swung to guide the front edge of the photosensitive material in a direction different from the direction of conveyance of the image-receiving material. The separating pawl goes in between the photosensitive material and the image-receiving material so that the photosensitive material and the image-receiving material are positively separated from each other. The photosensitive material and the image-receiving material are then conveyed in different directions for prevention of the jamming. Therefore, the following processing operations can be achieved smoothly.

In order to satisfy the fourth specific object, according to the invention, the photosensitive material provided in the form of a roll is cut to a predetermined length before being conveyed. When a photosensitive material length detector detects the photosensitive material which is shorter than a predetermined length for optical exposure but longer than a predetermined minimum conveyable length, only an operation of supplying the image-receiving material is suspended. When the detector detects the photosensitive material to be shorter than the predetermined minimum conveyable length, both the operation of supplying the image-receiving material and an operation of conveying the photosensitive material are suspended.

That is, in the case where the photosensitive material cut is not long enough for optical exposure but is long enough for conveyance to a discarding section, the image-receiving-material supplying operation is suspended, so that the photosensitive material is discarded without undergoing the image transferring operation. In the case where the photosensitive material is shorter than the minimum length which permits the conveyance of the photosensitive material in the apparatus, upon detection by the detecting means the conveyance of the photosensitive material is suspended and the image-receiving-material supplying operation is also stopped.

In the present specification, that term "photosensitive material" as used herein is intended to mean a material which is subjected to optical exposure to form a latent image thereon and is then developed to form the latent image. Preferably, the development is by pressure.

In this connection, a method may be employed in which prior to the pressure application, the photosensitive material is subjected to thermal developing or wet developing.

One example of such a photosensitive material, in which the polymerizing compound is hardened through optical exposure according to an image to be recorded and the image is developed by pressure, has been disclosed by Japanese patent application (OPI) No. 179,836/1982, filed by the present applicant. The photosensitive material is made up of a layer of synthetic macromolecular resin wall capsules containing vinyl compound, photopolymerization initiator and colorant precursor formed on a support.

The specifications of Japanese patent application (OPI) No. 278,849 and Japanese patent application No. 53,811/1986 have disclosed examples of photosensitive material of the type in which a latent image is formed on a silver halide layer by optical exposure and is developed by heating. After the polymerizing compound is hardened in synchronization with thermal developing operation, a visible image is obtained by application of pressure to the photosensitive material. In the case of the former photosensitive material disclosed by Japanese patent application (OPI) No. 278,849/1986, after the photosensitive material is subjected to thermal developing, the color image forming material is transferred onto an image-receiving material having an image-receiving layer so that the image is formed on the image-receiving material. The support of the photosensitive material is coated at least with a photosensitive silver halide, a reducing agent, a polymerizing compound and a color image forming material, at least the polymerizing compound and the color image forming being contained in the same capsule. In the latter photosensitive material disclosed by Japanese patent application No. 53,881/1986, an image is formed on the photosensitive material without using the image-receiving material. More specifically, the photosensitive material is made up of a photosensitive layer of the silver halide, the reducing agent, the polymerizing compound and two kinds of materials which show a coloring action when contacted. The photosensitive layer is formed on a support. One of the two kinds of coloring action materials together with the polymerizing compound is contained in microcapsules and the other is outside the microcapsules containing the polymerizing compounds.

An example of an thermally developing photosensitive material has been disclosed by Japanese patent application (OPI) No. 58,543/1983 entitled "Thermal Developing Color Photosensitive Material". The photosensitive material comprises a support and an overlying layer. The overlying layer includes a photosensitive silver halide, an organic silver salt oxidizing agent, a binder, and pigment supplying material formed on the support. The pigment supplying material is reductive with the photosensitive silver halide and/or organic silver salt oxidizing agent and acts with the photosensitive silver halide and/or organic silver salt oxidizing agent when heated, to discharge hydrophilic pigment. Such a thermal developing photosensitive material, when subjected to optical exposure and then to thermal developing, simultaneously provides a silver image in its exposed region and the movable hydrophilic pigment in the region of the silver image. In other words, when the thermal developing photosensitive material is exposed to light to form a latent image and heated for developing the latent image, then an oxidation-reduction reaction takes place between the organic silver salt oxidizing agent and the reductive pigment supplying material with the photosensitive silver halide exposed as catalyst. As a result, a silver image is formed on the exposed region. In this operation, the pigment supplying material is oxidized into an oxidant by the organic silver salt oxidizing agent. The oxidant cleaves in the presence of a pigment discharge assistant, thus discharging movable hydrophilic pigment. Thus, the silver image and the movable hydrophilic pigment are obtained in the region exposed to light. This pigment is transferred onto the image-receiving material to form a color image thereon.

Another example of the thermal developing photosensitive material has been disclosed, for instance, by Japanese patent application (OPI) No. 152,440/1984 entitled "Image Forming Method". The thermal developing photosensitive material is made up of a support, and a photosensitive layer on the support which contains at least photosensitive silver halogenide, binder and non-movable pigment supplying material which is reductive and which discharges movable hydrophilic pigment generally when heated but not when reacted with the photosensitive silver halogenide. The thermal developing photosensitive material, when exposed to light t form a latent image and then heated to develop it, provides a silver image in its region exposed and hydrophilic pigment movable in the other region.

Other examples of the photosensitive material are color diffusion transfer photosensitive materials which have been disclosed by U.S. Pat. Nos. 3,362,821, 3,485,628, 3,415,644, 3,415,645, 3,573,043, 3,594,164, 3,594,165, 3,698,896, 3,628,952, 3,728,113, 3,907,563, 4,076,529, 4,199,354, 3,928,312, 4,135,929, 4,053,312, 4,198,235, 4,336,322, 4,139,379, 4,199,354, 4,421,846; UK Pat. Nos. 1,496,363 and 2,090,090; Research Disclosure Nos. 13024 (1975), 15157 and 15162 (1976); and Japanese patent application (OPI) Nos. 130927/1979, 142530/1981, 164342/1981, 119345/1982, 37646/1983 and 37645/1983. The color diffusion transfer photosensitive material is made up of an image providing layer contained at least one silver halide emulsion layer combined with pigment image forming material coated on a support. The image providing layer is subjected to optical exposure to form a latent image and is then caused to contact alkaline treatment solution to develop it. The diffusible pigment distributed according to the image or at least part of its precursor is transferred through diffusion onto the image-receiving layer which is laid or to be laid on the image providing layer, to form a color image.

The image recording apparatus according to the invention includes a thermal developing device when the photosensitive material is of the type that a thermal developing operation is carried out before the image is fixed by pressure. On the other hand, it includes no thermal developing device when the photosensitive material is of the type not requiring a thermal developing operation. Furthermore, in the case employing the photo sensitive materials of the type that no image-receiving material is used and the image is fixed by pressure, a conveying mechanism for supplying the image-receiving material to the apparatus and taking it out of the apparatus is eliminated from the apparatus.

DETAIL DESCRIPTION OF THE PREFERRED EMBODIMENT

A first embodiment of this invention will be described with reference to the case where a photosensitive material is subjected to thermal developing prior to pressure transferring.

Figure 2:
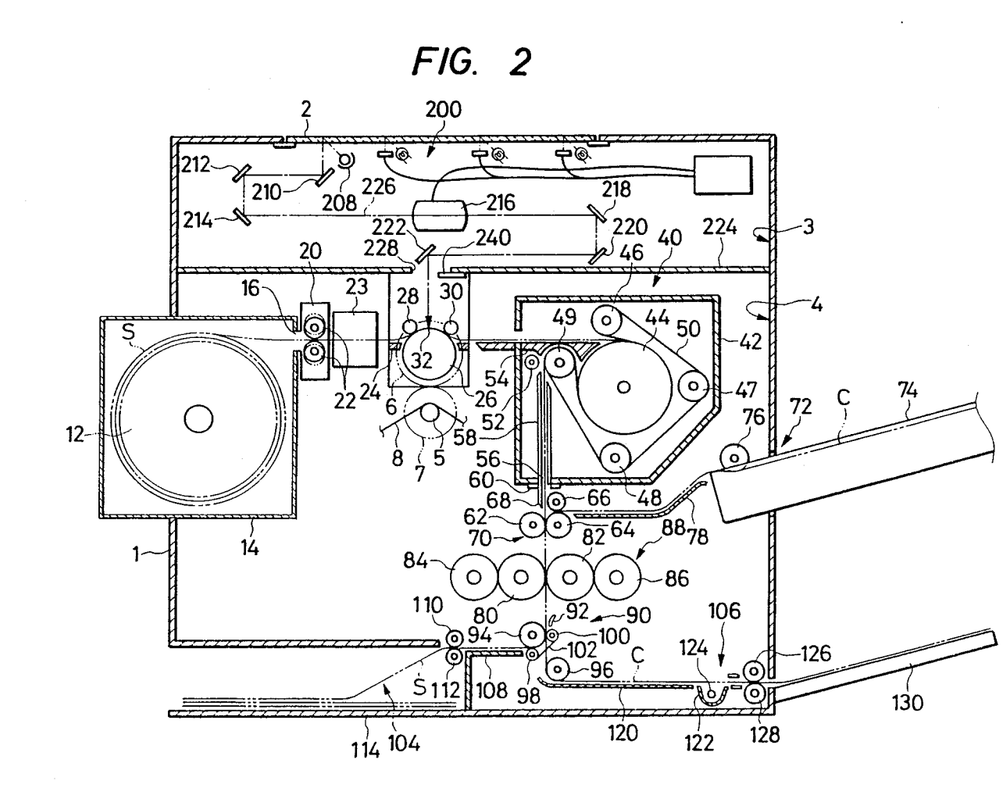
FIG. 2 is a sectional view showing the arrangement of an image recording apparatus according to this invention.

FIG. 2 is a sectional view of an image recording apparatus according to the invention, which is made up of the upper unit 3 and the lower unit 4. An image-forming optical system 200 and an exposed material supporting roll 26 are arranged in the upper unit 3. In the image-forming optical system 200, an illuminating lamp 208 and mirrors 210, 212 and 214 scan the lower surface of an original supporting glass plate 2 as one scanning unit. The scanned light is received by an assembly 216 of an image forming lens and a filter unit. Mirrors 218 and 220 are moved by a half ($\frac{1}{2}$) of the scanning distance of the scanning unit including the illuminating lamp 208 etc. The scanned light is finally received by a stationary mirror 222.

An exposed material supporting roll 26 is provided below the optical system 200. More specifically, the roll 26 is provided below a partition wall 224 between the upper and lower units 3 and 4 in such a manner that it is rotatably supported on the side walls of the upper unit 3. An opening 228 is formed in the partition wall 224 so that the optical axis 226 of the image-forming optical system 200 extends through the opening 228. The opening 228 is provided with a shutter device 240.

A thermal developing device 40 and a pressure transferring device 88 are provided in the lower unit 4. A photosensitive material S is processed while being conveyed in the lower unit 4 by a conveying device which is driven through a chain 8 by a photosensitive material conveying device drive source 5.

The exposed material supporting roll 26 has a gear 6 in such a manner that the gear 6 is coaxial with the roll 26. Similarly, the drive source 5 is provided with a gear 7 in such a manner that the gear 7 of the drive source 5 is coaxial with the drive source 5. When the upper unit 3 and the lower unit 4 are joined together, the gears 6 and 7 are engaged with each other so that the driving force of the drive source 5 is transmitted to the supporting roll 26. When the upper unit 3 and the lower unit 4 are put together as was described above, the exposed material supporting roll 26 is shielded from external light.

A photosensitive material cartridge 14 is detachably mounted on the left side of a housing 1. The cartridge 14 incorporates a photosensitive material roll 12, i.e., a roll of photosensitive material S. The cartridge 14 has an outlet 16 for the photosensitive material S. At the outlet 16, a pair of photosensitive material feeding rolls 22 are housed in a magazine connect dark box 20 and operate so that the photosensitive material S wound on the roll 12 is fed by a predetermined length at a predetermined time.

When the front end of the photosensitive material S approaches the photosensitive material feeding rolls 22, the feeding rolls 22 are moved away from each other as indicated by the phantom lines, to allow the photosensitive material S to pass with ease. A cutter unit 23 for cutting the photosensitive material S and a guide board 24 are arranged forwardly of the magazine connect dark box 20 (the term "forwardly" as used herein is intended to mean "downstream or in the direction of movement" of the photosensitive material or the like).

The aforementioned exposed material supporting roll 26 and two nip rolls 28 and 30 abutted against the supporting roll 26 are arranged forwardly of the guide board 24. The photosensitive material S, being guided by the guide board 24, is brought into close contact with the supporting roll 26 by the nip rolls 28 and 30 so that, at a position 32 between the nip rolls 28 and 30, the photosensitive material S is subjected to exposure. That is, the image of the original is formed on the photosensitive material S by the image-forming optical system 200.

The thermal developing device 40 is disposed forwardly of the exposed material supporting roll 26. The thermal developing device 40 is used to heat the exposed photosensitive material S to develop the image, as is well known in the art. The thermal developing device 40 includes a heat insulation developing housing 42, a heating roll 44 heated to about 120° C. and four belt supporting rolls 46, 47, 48 and 49. An endless belt 50 is supported by the four belt supporting rolls 46, 47, 48 and 49 and is wound on the heating roll 44 through about 270°. A nip roll 52 abuts against the supporting roll 49 under a pressure. Those components 44, 46, 47, 48, 49, 50 and 52 are accommodated in the insulted housing 42.

The thermal developing device 40 further comprises a guide 54 for guiding the photosensitive material S from the exposed material supporting roll 26 to the heating roll 44 and for separating the photosensitive material S heated and developed from the heating roll 44. Further, a vertical guide 58 guides to an outlet 56 the photosensitive material S which has been developed and conveyed by the supporting roll 49 and the nip roll 52. A sensor 60 located at the outlet 56 detects the front end of the photosensitive material.

Right below the outlet 56, a photosensitive material and image-receiving-sheet piling device 70 is provided which comprises a pair of abutment rolls 62 and 64; a nip roll 66 abutted against the abutment roll 64; and a guide member 68 for guiding the photosensitive material S to the nip region of the rolls 62 and 64.

An image-receiving-sheet supplying device 72 is disposed on the right side of the photosensitive material and image-receiving-sheet piling device 70. The image-receiving-sheet supplying device 72 is constructed as follows. An image-receiving-sheet supplying cassette 74 is detachably inserted into the housing 1 in such a manner that it protrudes from the housing 1. An image-receiving-sheet feeding roll 76 supplies image receiving sheets C from the cassette 74. A guide board 78 guides each sheet C supplied through the feeding roll 76 to the nip region of the abutment roll 64 and the nip roll 66. The width of the image receiving sheet C is smaller by about 6 mm than that of the photosensitive material S. The image receiving sheet C and the photosensitive material S are placed one on another by the photosensitive material and image-receiving sheet piling device 70 in such a manner that the image receiving sheet C is at the center of the photosensitive material S.

A transferring device 88 is provided below the piling device 70. The transferring device 88 comprises a pair of pressurizing nip rolls 80 and 82 and back-up rolls 84 and 86 for evening the pressurization of the nip rolls 80 and 82 in the axial direction. The nip rolls 80 and 82 are abutted against each other under a pressure of about 500 kg/cm$^2$. The pressurizing nip rolls 80 and 82 may be driven by a motor (not shown) via drive gear and key positioned at a side of the nip roll, respectively.

A photosensitive material and image-receiving-sheet separating device 90 is provided below the transferring device 88. The separating device 90 comprises a guide member 92, first and second conveying rolls 94 and 96, and a separating belt 102 laid over guide rolls 98 and 100 in such a manner that at both sides of the first conveying rolls 94 the belt 102 is pushed against only the photosensitive material S.

A photosensitive material discarding section 104 is provided on the left side of the separating device 90, and a fixing device 106 is on the other side. The photosensitive material discarding section 104 comprises a guide member 108, a pair of conveying rolls 110 and 112, and a discarding box 114. In the discarding section 104, the photosensitive material S from the separating device 90 is guided by the guide member 108 and is delivered into the discarding box 114 by the conveying rolls 110 and 112.

The fixing device 106 comprises a guide member 120, an ultraviolet lamp 124 with a reflecting member 122, and a pair of conveying rolls 126 and 128. In the fixing device 106, the image-receiving sheet C delivered from the separating device 90 is guided by the guide member 120 and is then exposed to ultraviolet rays for fixing for about five (5) seconds.

A tray 130 for receiving the sheet C is provided in front of the fixing device in such a manner that it protrudes from the housing 1.

In the above-described embodiment, the drive force is transmitted from the conveying device drive source 5 to the exposed photo-sensitive material supporting roll 26 through the gears 6 and 7. However, other power transmitting means such as a chain may be employed to transmit the drive force.

The positions of the optical systems 200 and the exposed photo-sensitive material supporting roll 26 are determined when the upper unit 3 is assembled. Even when the upper unit 3 is joined to the lower unit 45, the positional relationship between the optical system 200 and the exposed photosensitive material supporting roll 26 is maintained unchanged. That is, the installation accuracy thereof is maintained unchanged.

In the image recording apparatus of the first embodiment of the invention the exposed photosensitive material supporting roll and the image-forming optical system are provided in one and the same unit. Therefore, the positional accuracy of the exposed photosensitive material supporting roll with respect to the image-forming optical system is considerably high so that the image of the original can be formed clearly on the photosensitive material. Even when the unit is combined with the other unit, the positions of the exposed photosensitive material supporting roll and the image-forming optical system are maintained unchanged, and the image-forming focal length is never changed. Furthermore, in the apparatus of the invention, the exposed photosensitive material supporting roll is driven by the drive source which drives the photosensitive material conveying device. Therefore, in the exposing section the photosensitive material is conveyed at the same speed as it is conveyed in the preceding or following processing section. Accordingly, the image of the original is formed on the photosensitive material with high accuracy and the resultant record is considerably high in picture quality.

A second embodiment of this invention will be described in which, similarly to the first embodiment, employs a photosensitive material of the type that a thermal developing operation is carried out prior to a pressure transferring operation.

Figure 3:
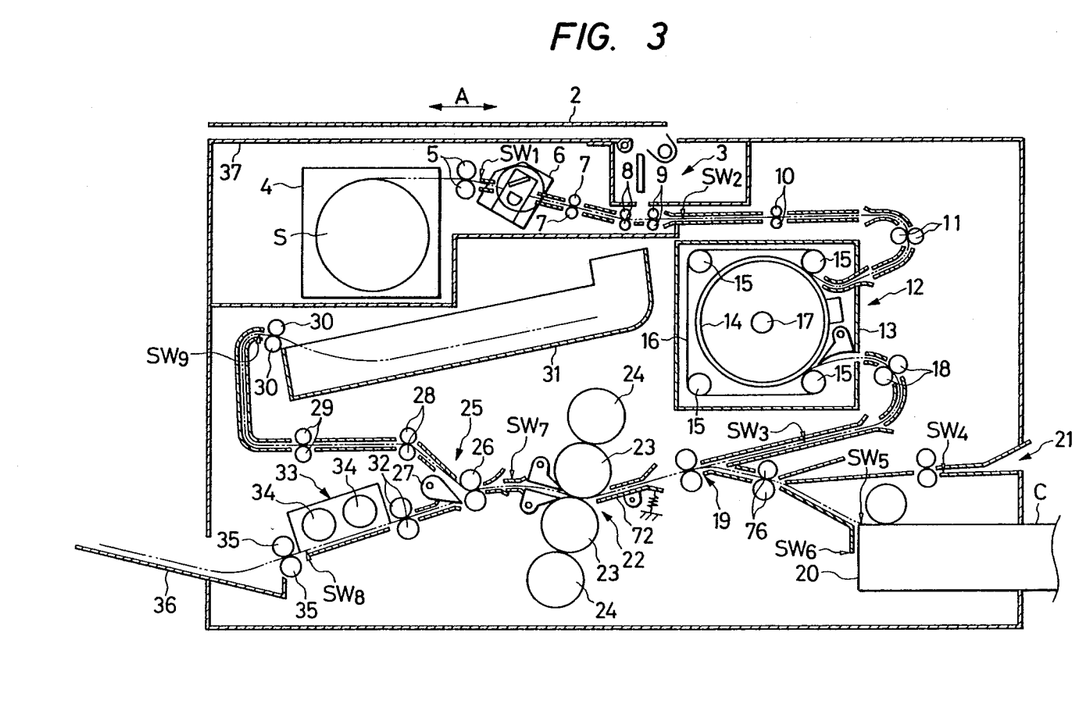
FIG. 3 is a sectional view showing a second embodiment of an image recording apparatus according to this invention.

FIG. 3 is a sectional view showing the second embodiment of the inventive image recording apparatus.

As shown in FIG. 3, a transparent glass plate 302, on which an original is placed, is provided on top of a housing 301, and an exposing device 303 is provided below the glass plate 302. The exposing device 303 is fixed in the housing 301. The glass plate 302 is reciprocated horizontally (or in the directions of the arrow A) by drive means (not shown).

A photosensitive material S is wound in the form of a roll in a magazine 304 and is pulled out of it with a pair of feeding rolls 305. An upper cover 337 is turned about its right end to load the magazine 304 in the apparatus or to unload it therefrom. The photosensitive materials S pulled out of the magazine 304 is conveyed to an optical exposure section 303 by conveying rolls 307, 308 and 309, where it is subjected to optical exposure and cut to a predetermined length. That is, a latent image is formed on the photosensitive material cut in the form of a sheet. This photosensitive material S is conveyed to a thermal developing device 312 by conveying rolls 310 and 311.

The thermal developing device 312 comprises a heat insulation housing 313, a hollow cylinder-shaped heating roll 314, four belt supporting rolls 315, and an endless belt 316 laid over the supporting rolls 315 and wound on the heating roll 314 through about 240°. These components 314, 315 and 316 are provided within the housing 313. A halogen lamp 317 is arranged inside the heating roll 314. The photosensitive material S is conveyed while being held between the belt 316 and the heating roll 314. That is, the photosensitive material S is heated by the lamp 317 while being conveyed by the belt 316 and the heating roll 314.

The photosensitive material S subjected to thermal developing by the thermal developing device 312 is moved out of the insulation housing 313 and then forwarded to a piling section 319 by conveying rolls 318. At the piling section, the photosensitive material S is laid on an image-receiving sheet C supplied, from an image-receiving sheet cassette 320 or through a manual sheet inserting section 321. The photosensitive material S and the image-receiving sheet C thus piled one on another are conveyed to a pressure transferring device 322.

The pressure transferring device 322 is made up of a pair of pressurizing rolls 323 and 323, and backup rolls 324 abutted against the pressurizing rolls 323 under pressure. A blade 372 is provided at the inlet of the pressure transferring device 322 in such a manner that its end is elastically in contact with the pressurizing roll 323 to prevent the photosensitive material S and the image-receiving sheet C from being creased. A pressure of about 550 kg/cm$^2$ is applied to the stack of the photosensitive material S and the image-receiving sheet C so that the image formed on the photosensitive material S is transferred onto the image-receiving sheet C. Thereafter, the photosensitive material S and the image-receiving sheet C are forwarded to a separating device 325.

The separating device 325 comprises conveying rolls 326 and a separating pawl 327 provided downstream of the conveying rolls 326. The separating pawl 327 is swung so that its end goes in between the photosensitive material S and the image-receiving sheet C to separate them form each other.

The photosensitive material S separated from the image-receiving sheet C by the separating device 25 is delivered into a discarding tray 331 by conveying rolls 328, 329 and 330 so that it is discarded or stored. On the other hand, the image-receiving sheet C, to which the image has been transferred, after being separated from the photosensitive material S, is conveyed to a fixing device 333 by conveying rolls 332. At the fixing device 333, the image-receiving sheet C is irradiated, for instance, by ultraviolet rays from an ultraviolet lamp 334, so that the image is fixed. The sheet C thus treated is delivered to an outlet tray 336 by conveying rolls 335.

The processing devices forming the image recording apparatus will be described in more detail.

Figure 4:
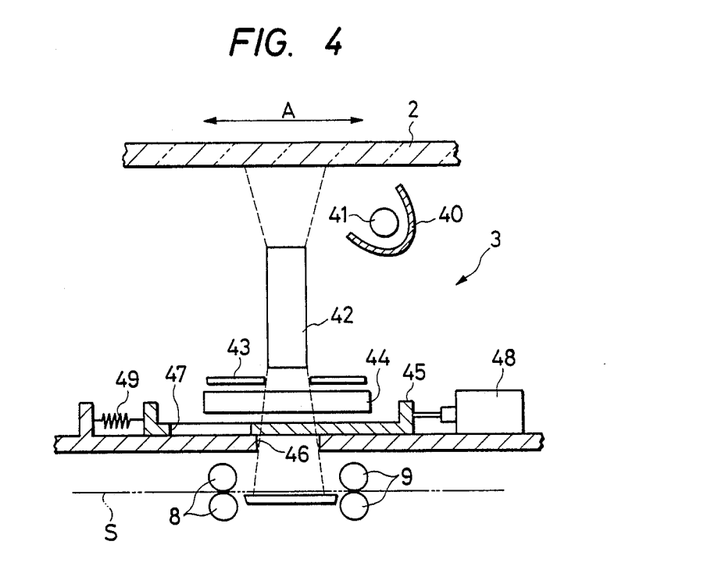
FIG. 4 is a sectional view of an exposing device.

FIG. 4 is a sectional view of the exposing device 303. The exposing device is disposed below the glass plate 302 which is moved in the directions of the arrow A by the drive means (not shown). The exposing device 303 comprises an exposure lamp 341 with a reflector 340, an image-forming lens 342, a lens stop device 343, a color adjusting device 344, and a shutter device 345. When a partition wall opening 346 is opened by the shutter device 345, the photosensitive material S below the opening 346 is optically exposed so that a latent image is formed on the photosensitive material S. The shutter device 345 has an opening 347. As the glass plate 302 is moved to the right in FIG. 4, the shutter device 345 is moved to the right by a solenoid 348. When the openings 346 and 347 are aligned with each other, the latent image is formed on the photosensitive material S. When the movement of the glass plate 302 to the right is stopped, the operation of the solenoid 348 is stopped. As a result, the shutter device 345 is moved to the left by a spring 349 to thereby close the partition wall opening 346. At the same time, the glass plate 302 is returned to the original position on the left hand side.

Figure 5:
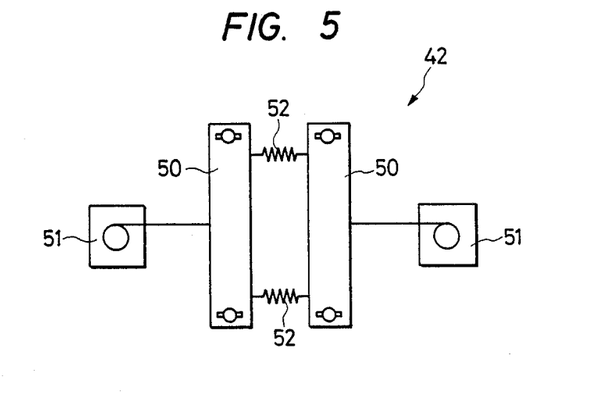
FIG. 5 is a plan view of a lens stop device.

FIG. 5 is a plan view of the lens stop device 343. The lens stop device 343 comprises a pair of shielding boards 350. The shielding boards 350 are movable in the directions of the arrow A of FIG. 4. The shielding boards 350 are driven by respective stepping motors 351 and are coupled to each other through springs 352. The lens 342 is positioned above the center of the space between the shielding boards 350. The lens 342 is optically stopped by varying the distance between the shielding board 350 through the springs 352 by means of the stepping motors 351.

Figure 6:
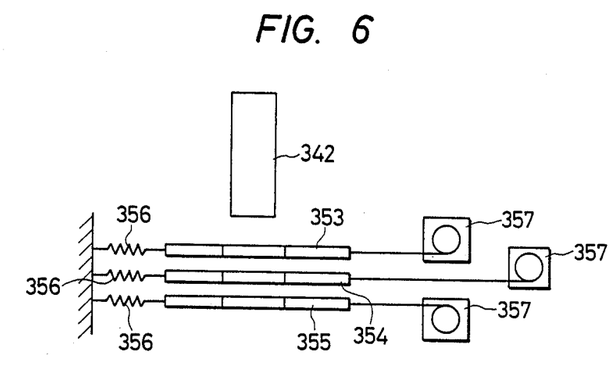
FIG. 6 is a sectional view of a color adjusting device.

FIG. 6 is a side view of the color adjusting device 344. As shown in FIG. 6, a yellow filter 353, a magenta filter 354 and a cyan filter 355 are disposed below the lens 342. These filters have first ends supported elastically by separate springs 356 and the other ends connected to separate stepping motors 357 so that the filters are individually movable horizontally. Each of the filters 353, 354 and 355 has three regions of different density. The filters 353, 354 and 355 are driven by the stepping motors 357 so that the variable density regions of the filters are variously combined for color control.

Figure 7:
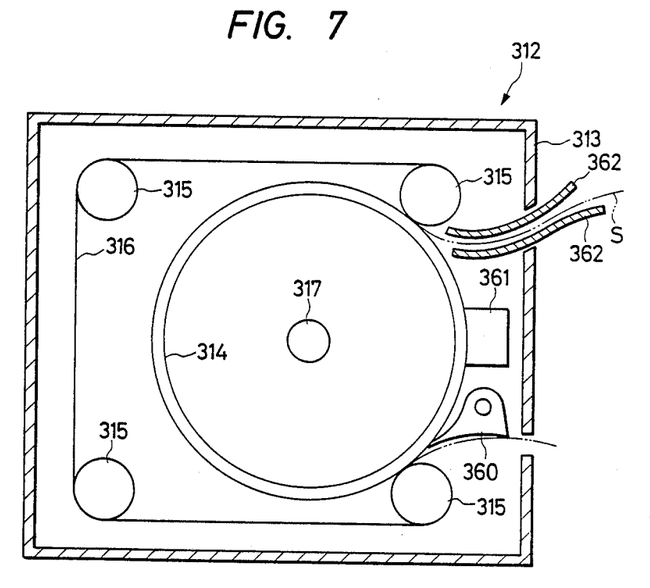
FIG. 7 is a sectional view of a thermal developing device.

FIG. 7 is a sectional view of the thermal developing device 312. The hollow cylindrically shaped heating roll 314 of aluminum is arranged inside the heat insulation housing 313, and the halogen lamp 317 is provided inside the heating roll 314. The heating roll 314 is 100 mm in diameter, 260 mm in length, and 4 mm in wall thickness and has its surface coated with "Teflon". The belt supporting rolls 315 are 232 mm in length, being slightly shorter than the heating roll 314. The belt 316 is made of silicone rubber. The belt 316 is laid over the belt supporting rolls 315 and the heating roll 314. More specifically, the belt 316 is wound on the heating roll 14 through about 240°, as was described above. The width of the belt 316 is 230 mm, being shorter than the length of the belt supporting rolls 315.

The heating roll 314 is heated to a temperature of 120° to 150° C. by the halogen lamp 317 (400W), thus heating the photosensitive material S for about twenty seconds while holding it together with the belt 316. The thermal developing device 312 is provided with a thermal fuse to prevent the excessive temperature rise of the heating roll 314.

The thermal developing device 312 has separating pawls 360 which are used to separate the photosensitive material from the heating roll 314 after it has been subjected to thermal developing. More specifically, four to six separating pawls 360 are arranged along the heating roll 314, and have the ends abutted against the heating roll 314 under a pressure of about 10 grams force. A cleaner 361 of felt cleans the surface of the heating roll 314 and is located downstream of the separating pawl 360 in such a manner that it abuts against the heating roll 314 under a pressure of 100 to 200 grams force. Guide boards 362 for leading the photosensitive material S to the heating roll 314 include heaters which are used to heat the photosensitive material S to 100° C. in advance.

Figure 8:
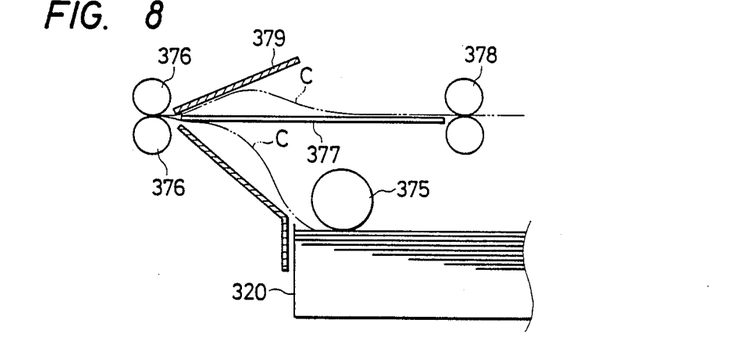
FIG. 8 is a sectional view showing an image-recording sheet supplying section.

FIG. 8 is a sectional view of an image-receiving sheet supplying section. An image-receiving sheet C which is supplied from the image-receiving sheet cassette 320 by a sheet supplying roll 375 abuts against a pair of resist rolls 376 and is thus held bent along a guide plate 377. On the other hand, an image-receiving sheet C which is supplied through the manual sheet inserting section 321 by a pair of sheet supplying rolls 378 abuts against the same resist rolls 376 and is thus held bent along a guide plate 379. The image-receiving sheet C thus held in one or the other of the two supply routes is conveyed to the piling section 319 by the resist rolls 376 in synchronization with the photosensitive material S.

Figure 9:
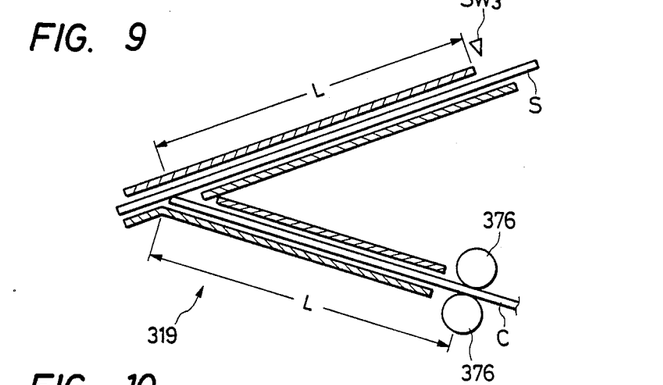
FIG. 9 is a sectional view of a piling section.

FIG. 9 is a sectional view of the piling section 319. The previously mentioned resist rolls 376 are driven to convey the image-receiving sheet C a predetermined time after a sensor SW3 detects the front end of the photosensitive material S which has been subjected to thermal developing. That is, the photosensitive material S is laid on the image-receiving sheet C in such a manner that the distance (L) between the sensor $SW_3$ and the line of intersection of the photosensitive material S and the image-receiving sheet C is equal to the distance (L) between the line of intersection and the resist rolls 376. That is, he photo-sensitive material S is positioned slightly ahead of the image-receiving sheet C.

Figure 10:
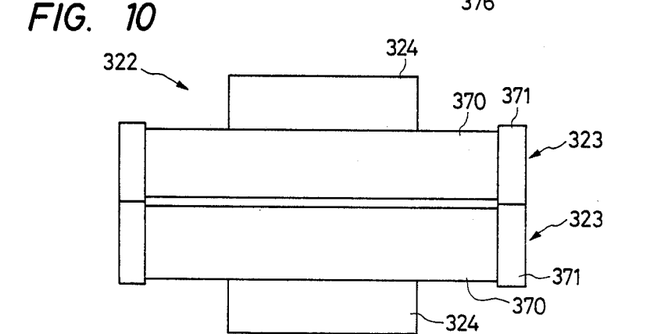
FIG. 10 is a front view of a pressure transferring device.

FIG. 10 is a front view of the pressure transferring device 322. Each of the pressurizing rolls 323 is made up of a cylindrical body 370 and flanges 371, both of high carbon steel (SK3). The flanges 371 of the pressurizing rolls 323 abut against one another so as to transmit a drive force from one of the pressurizing rolls 323 to the other. The photosensitive material S and the image-receiving sheet C, which have been piled one on another, are pressed by the cylindrical bodies 370. Each of the cylindrical bodies 370 is 230 mm in length and 40 mm in diameter. Each of the flanges 371 is 10 mm in length and 40.16 mm in diameter. As is apparent from the above description, the flange 371 is slightly larger in diameter than the cylindrical body 370 so that the photosensitive material S and the image-receiving sheet C can be readily inserted between the cylindrical bodies 370.

The pressurizing rolls 323 apply a pressure of about 550 kg/cm$^2$ to the photosensitive material S and the image-receiving sheet C so that the image is transferred from the photosensitive material S onto the image-receiving sheet C. The pressure applied is preferably in the range of from 400 kg/cm$^2$ to 600 kg/cm$^2$.

In the transferring device 322, the pressurizing rolls 323 and the backup rolls 324 are driven by a drive source different from that which is provided for the exposuring device 303. The transferring device 322 is preferably driven by an independent drive source. However, the conveying system provided downstream of the pressure transferring device 322 may be driven by the drive source provided for the transferring device 322.

Figure 11:
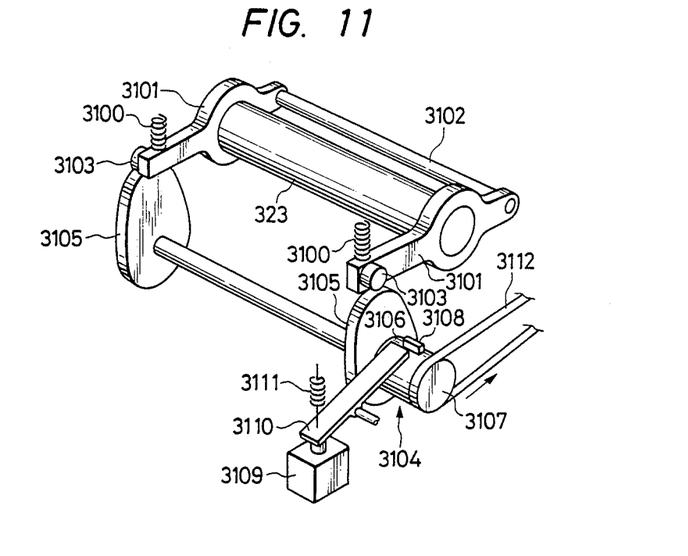
FIG. 11 is a perspective view showing a pressure releasing mechanism for the pressure transferring device.

The pressure transferring device 322 can be pulled forwards to remove any jamming of the photosensitive materials and the image-receiving sheet C. In this operation, the pressurizing rolls 323 can be released by using a spring clutch. As shown in FIG. 11, the pressurizing roll 323 is urged by springs 3100 to provide a pressurizing force and it can be turned about a shaft connected between the ends of pressurizing arms 3101. Cam followers 3103 are provided on the other ends of the pressurizing arms 3101. The cam followers 3103 abut against eccentric cams 3105 provided for a driven clutch 3106 section of the spring clutch 3104. A driving clutch section 3107 of the spring clutch 3104 is driven through a chain or belt 3112. The driven clutch section 3106 of the spring clutch 3104 has a protrusion 3108. The protrusion 3108 is locked by a locking arm 3110 which is urged into locking the protrusion 3108 by a spring 3110 when a solenoid 3109 is not energized. Accordingly, during pressurization, no drive force is transmitted to the eccentric cams 3105 and the small-diameter parts of the eccentric cams 3105 are in contact with the cam followers 3103. When the solenoid 3109 is energized, the locking arm 3110 is moved away from the protrusion 3108 against the elastic force of the spring 3111. As a result, the drive force is transmitted from the driving clutch section 3107 to the driven clutch section 3106 and therefore the eccentric cams 3105 are turned while being kept in contact with the cam followers 3103. Therefore, when the large-diameter parts of the eccentric cams 3105 are brought into contact with the cam followers 3103, the pressurizing arms 3101 are turned about the shaft 3102 so that the pressurization is intermittently suspended.

Figure 12A:
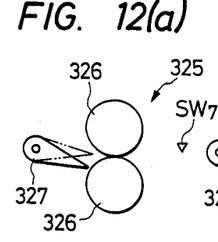
FIG. 12(a), 12(b) and 12(c) are sectional views of a separating device.
Figure 12B:
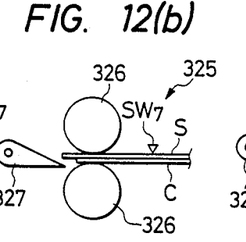
Figure 12C:
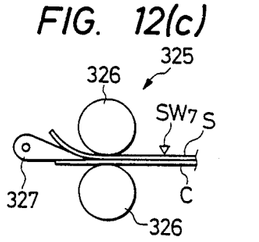

FIGS. 12(a), 12(b) and 12(c) are sectional views showing the separating device 325 which separates the photosensitive material S and the image-receiving sheet C from each other after the image has been pressure transferred onto the image-receiving sheet C. A sensor SW$_7$ detects the photosensitive material S upstream of the conveying rolls 326. The separating pawl 327 located downstream of the conveying rolls 326 is swung vertically. The separating pawl 327 is normally held at the position indicated by the solid line in FIG. 12(a) and is swung upward to the position indicated by the chain line by a solenoid (not shown). The photosensitive material S and the image-receiving sheet C piled one on another are conveyed to the separating device 325 and counted by a sensor SW9 when conveyed to the discarding tray 331. A display section displays the fact when the number of photosensitive materials S thus counted reaches the storage capacity of the discarding tray 331.

Figure 13:
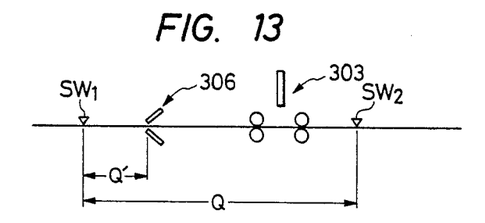
FIG. 13 is an explanatory diagram for a description of the conveyance control of a photosensitive material.

Whenever the image recording operation is carried out, the photosensitive material S is pulled out of the roll stock of the magazine 304 and cut to the predetermined length. However, the image recording apparatus is so controlled that, when the length of the photosensitive material S remaining in the roll stock is shorter than the predetermined length, the supply of the image-receiving sheet is suspended. This control operation will be described with reference to FIG. 13. As shown in FIG. 13, Sensors $SW_1$ and $SW_2$ are provided upstream of the cutter 306 and downstream of the exposing device 303, respectively, with a distance Q between the sensors $SW_1$ and $SW_2$. The distance Q is shorter than the length $C_{max}$ of the image-receiving sheet C. When the second sensor $SW_2$ detects the front edge of the conveyed photosensitive material S, the conveyance of the photosensitive material S is suspended. If, in this case, the rear edge of the photosensitive material S is downstream of the first sensor $SW_1$ that is, it is not detected by the first sensor $SW_1$, no exposure is carried out and no image-receiving sheet C is supplied. If, on the other hand, the rear end of the photosensitive material S is upstream of the first sensor $SW_1$ the photosensitive material S is then detected by the sensor $SW_1$ so that the conveyance of the photosensitive material S is again carried out and a counting operation for timing is started. When the count value reaches a predetermined value corresponding to the length ($C_{max}-Q$), the cutter 306 is activated so that the photosensitive material S is cut to the length $C_{max}$ (corresponding to the image-receiving sheet C) while being subjected to optical exposure. If the rear edge of the photosensitive material S is detected by the first sensor $SW_1$ before the count value reaches the predetermined value, the photosensitive materials S is not delivered to the thermal developing device 312 and no image-receiving sheet C is supplied.

When the photosensitive material S is not long enough for the image recording operation and no image-receiving sheet C is supplied, it is determined whether or not the photosensitive material S should be conveyed. During the conveyance of the photosensitive material S, the first sensor $SW_1$ starts its counting operation when the cutter 306 is operated so that the count value obtained until the rear edge of the photosensitive material S is detected is converted into a length. If the length is represented by S', then the length of the last piece of photosensitive material S is the sum of the aforementioned length S' and the distance Q' between the sensor $SW_1$ and the cutter 306. On the other hand, the minimum length S'' of the photosensitive materials S which can be conveyed is stored in a memory in advance so that the minimum length S'' thus stored is compared with the length (Q'+S') of the last piece of photosensitive material S to determined whether or not the last piece of photosensitive material S should be conveyed. When it is determined that photosensitive material S should be conveyed, supplying of the image-receiving sheet is suspended, and the photosensitive material S is conveyed to the discarding tray 331 through the conveying path shown or it is delivered into the discarding tray 331 directly through an unillustrated conveying path. If the length of the photosensitive material is not long enough, the conveyance of the photosensitive material is suspended upon detection of its rear edge and the upper cover 337 is opened to remove the photosensitive materials S. When the photosensitive material S is not long enough for the image recording operation as was described above, the supply of the image-receiving sheet C is suspended and the fact that no photosensitive materials is available in the apparatus is displayed on the display section.

Alternatively, it is determined whether or not the photosensitive material S is long enough for conveyance. When the count value reaches a value corresponding to a length S''−Q (S'' being the minimum length of the photosensitive material S which can be conveyed in the apparatus), it is determined that the photosensitive material S can be conveyed in the apparatus. Therefore, supplying the image-receiving sheet is suspended and the photosensitive material S is conveyed to the discarding tray 31 through the conveying path shown or it is delivered into the discarding tray 31 directly through an unillustrated conveying path. When, on the other hand, the count value is smaller than the value corresponding to the length S''−Q, it is determined that the photosensitive material S is not long enough for conveyance. Thereafter, upon detection of the rear end, the conveyance of the photosensitive material is suspended and the upper cover 337 can be opened to remove the photosensitive material S. When the photosensitive material S is not long enough for the image recording operation as was described above, the supply of the image-recording sheet is suspended, and the fact that no photosensitive material is available in the apparatus is displayed on the display section.

Figure 14:
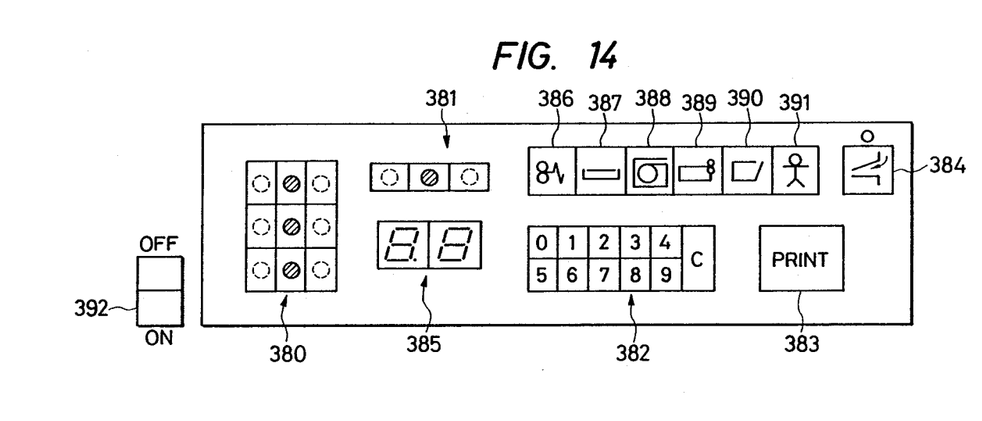
FIG. 14 is an explanatory diagram outlining an operating panel.

FIG. 14 is a plan view of the operating panel of the image recording apparatus according to the invention. The operating panel is provided with an operating section comprising, for instance, color control keys 380, density control keys 381, a ten-key key pad for inputting the number of sheets 382, a print start key 383 and a manual sheet inserting key 384 and a display section. The display section comprises a number-of-sheets display unit 385, a jamming display unit 386, an image-receiving sheet cassette empty display unit 387, a photosensitive material roll empty display unit 388, discarding tray full display units 389, a door open display unit 390 and a serviceman call display unit 391.

With the color control keys 380, the densities of the red, blue and yellow can be selected. The keys are depressed to turn on the internal coloring elements.

The density control keys 381 are used to select three different image densities thereby to achieve the density control.

The ten-key key pad 82 for the number of sheets is made up of ten digit keys "0" through "9" to set a desired number of sheets from "0" to "99". The number of sheets thus set can be reset with a clear key C. If the clear key C is depressed during recording, the number of sheets being counted is set to "0" while the recording operation is suspended.

The number-of-sheets display unit 385 is used to display numbers from "1" to "99". The value displayed is successively increased to the set number of sheets as the image recording operation is repeatedly carried out. A predetermined period of time after the image recording operation, the number displayed is reset to "0".

The print start key 383 has a light emitting element. For the period of time which elapses from the time instant the power switch is turned on until the apparatus is warmed up, the light emitting element emits red light, thus indicating that the apparatus is not yet operable. When the apparatus has been warmed up, the light emitting element emits green light, thus indicating that the apparatus is operatable. While the image recording operation is being performed or an error is being indicated, the light emitting element emits red light, thus inhibiting the operation of the print start key 383.

Figure 15:
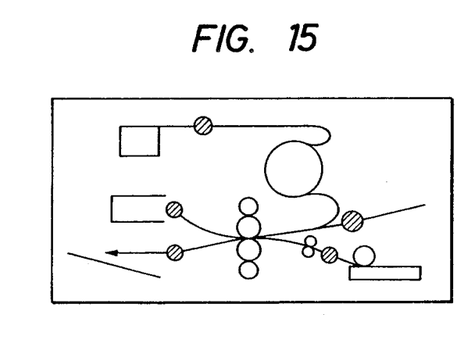
FIG. 15 is an explanatory diagram showing a display section.

The jamming, display section 386 is lit upon occurrence of jamming, and at the same time a jamming display panel shown in FIG. 15 is selective lit to indicate where the jamming has occurred. The display panel of FIG. 15 is provided inside the front door. However, it may be installed outside the apparatus.

The image-receiving sheet cassette empty display unit 387 is lit when all the image-receiving sheets C have been dispensed from the image-receiving sheet cassette 320 or the cassette 320 is loaded incorrectly.

The photosensitive material roll empty display unit 388 is lit when all the photosensitive material S has been dispensed from the magazine 304 or the magazine 304 is loaded incorrectly.

The discarding tray full display unit 388 is lit when a predetermined number of sheets of photosensitive material S has been delivered into the discarding tray 31.

The door open display unit 390 is turned on when, for instance, a front cover is opened.

The serviceman call display unit 391 is lit when it is necessary to call an expert for repair, for instance because the drive motor has been locked.

The manual sheet inserting key 384 is operated to allow a manual sheet inserting operation. When the key 384 is operated during an image recording operation, the image recording operation is suspended, and an interruption image recording operation is permitted.

A power switch 392 is installed beside the operation panel 392.

In the image recording apparatus of the second embodiment of the invention, the pressure transferring device and the exposing device are driven by the respective drive sources, as was described above. Therefore, even if, when the image is transferred onto the image-receiving sheet under pressure with the photosensitive material laid on the image-receiving sheet, impact is exerted on the transferring device and accordingly on the transferring device's drive source, thus varying the load, the exposing device's drive source is not affected by the variation of the load. Accordingly, the exposing device is driven at constant speed and is free from the variation of the load. As a result, the exposure is achieved with high reliability and with high accuracy. And the apparatus itself is stable in operation for along time and is high in durability.

We claim:

1. An image recording apparatus, comprising:
   a first unit for forming an image on a photosensitive material coated on a support, said first unit including an image-forming system and supporting means supporting said support during exposure of said photosensitive material; and
   a second unit detachably connectable to said first unit, for treating said exposed photosensitive material by pressure, said second unit including first drive means for driving said support means.

2. An image recording apparatus as recited in claim 1, wherein said image-forming system is an optical system.

3. An image recording apparatus as recited in claim 1, wherein said second unit further comprises second drive means.

4. An image recording apparatus as recited in claim 1, further comprising second drive means for said treating means, said first and second drive means being provided with respective first and second drive sources.

5. An image recording apparatus, comprising:
   means for forming an image on a photosensitive material coated on a support and including an optical exposing device having original scanning means, conveying means for said support, and a first drive source for said scanning and conveying means; and
   means for pressure transferring said image to said photosensitive material image-receiving material and including pressurizing rolls abutted against each other under pressure and a second drive source for said pressurizing rolls separate from said first drive source.

6. An image recording apparatus, comprising:
   a roll of photosensitive material;
   means for cutting said photosensitive material supplied from said roll to a predetermined length;
   means for forming a latent image on said photosensitive material;
   means for supplying said cut photosensitive material from said cutting means to said forming means;
   means for transferring said latent image from said photosensitive material to an image receiving material overlaid with said photosensitive material;
   means for conveying said cut photosensitive material and having a minimum conveyable length;
   length detecting means for detecting a length of said photosensitive material delivered from said cutting means; and
   control means for inhibiting said supplying means but not said conveying means when said length detecting means detects said detected length to be less than said predetermined length but longer than said minimum conveyable length and for inhibiting said supplying means and said conveying means when said length detecting means detects said detected length to be less than said minimum conveyable length.

7. An image recording apparatus as recited in claim 6, wherein said conveying means conveys said photosensitive material between said forming means and said transferring means.

8. A method of supplying a photosensitive material and an image-receiving material in an image recording device, in which said photosensitive material is exposed to form an image and said image is transferred onto said image-receiving material, comprising the steps of:
   cutting a photosensitive material provided in a roll to a predetermined length;
   detecting a length of said cut photosensitive material;
   supplying said cut photosensitive material to an optical exposure section;
   when said detecting step determines said detected length to be less than said predetermined length but longer than a predetermined minimum conveyable length, then interrupting said supplying step and instead conveying said cut photosensitive material to a tray; and
   when said detecting step determines said detected length to be less than said predetermined minimum conveyable length, then interrupting both said supplying step and said conveying step.

9. An image recording apparatus, comprising:
means for forming an image on a photosensitive material coated on a support;
overlaying means for overlaying said photosensitive material and an image-receiving material;
pressure transferring means for transferring said image from said overlaid photosensitive material to said overlaid image-receiving material; and
separating means for separating said overlaid photosensitive material and said image-receiving material positioned downstream of said pressure transferring means, said separating means comprising
conveying rolls for said overlaid photosensitive material and said image-receiving material,
material detecting means for detecting one of said overlaid photosensitive material and said image-receiving material, and
a separating pawl arranged downstream from said conveying rolls swingable into a path of said overlaid photosensitive material and said image-receiving material and operating in response to said material detecting means.

10. An image recording apparatus as claimed in claim 9, wherein said overlaying means positions a downstream side of said photosensitive material to be downstream of a downstream side of said image-receiving material and wherein said separating pawl swings to initially contact said downstream side of said photosensitive material but not said image-receiving material.

11. An image recording apparatus, comprising:
means for forming a latent image on a photosensitive material coated on a support;
means for transferring said latent image from said photosensitive material to an image receiving material overlaid with said photosensitive material;
an exposing device comprising at least an image forming system and supporting means for supporting said support, said exposing device provided as one unit; and
a drive source for driving said supporting means to convey said photosensitive material, said drive source being provided separately from said unit of said exposing device.

12. An image recording apparatus as recited in claim 11, wherein said one unit is detachably connectable to remainder of said apparatus.

* * * * *